United States Patent
Chen et al.

(10) Patent No.: US 11,877,433 B2
(45) Date of Patent: Jan. 16, 2024

(54) STORAGE NODE CONTACT STRUCTURE OF A MEMORY DEVICE

(71) Applicants: UNITED MICROELECTRONICS CORP., Hsin-Chu (TW); Fujian Jinhua Integrated Circuit Co., Ltd., Quanzhou (CN)

(72) Inventors: Pin-Hong Chen, Tainan (TW); Tsun-Min Cheng, Changhua County (TW); Chih-Chieh Tsai, Kaohsiung (TW); Tzu-Chieh Chen, Pingtung County (TW); Kai-Jiun Chang, Taoyuan (TW); Chia-Chen Wu, Nantou County (TW); Yi-An Huang, New Taipei (TW); Yi-Wei Chen, Taichung (TW); Hsin-Fu Huang, Taichung (TW); Chi-Mao Hsu, Tainan (TW); Li-Wei Feng, Tainan (TW); Ying-Chiao Wang, Changhua County (TW); Chung-Yen Feng, Hsinchu County (TW)

(73) Assignees: UNITED MICROELECTRONICS CORP., Hsin-Chu (TW); Fujian Jinhua Integrated Circuit Co., Ltd., Quanzhou (CN)

(*) Notice: Subject to any disclaimer, the term of this patent is extended or adjusted under 35 U.S.C. 154(b) by 98 days.

(21) Appl. No.: 16/931,397

(22) Filed: Jul. 16, 2020

(65) Prior Publication Data
US 2020/0350317 A1    Nov. 5, 2020

Related U.S. Application Data

(62) Division of application No. 15/922,899, filed on Mar. 15, 2018, now Pat. No. 10,756,090.

(30) Foreign Application Priority Data

Apr. 13, 2017    (CN) .......................... 201710239078.2

(51) Int. Cl.
*H01L 23/48* (2006.01)
*H10B 12/00* (2023.01)
(Continued)

(52) U.S. Cl.
CPC ... *H10B 12/0335* (2023.02); *H01L 21/28568* (2013.01); *H01L 21/7684* (2013.01);
(Continued)

(58) Field of Classification Search
CPC ......... H01L 27/10808; H01L 27/10855; H01L 27/10814; H01L 23/53266; H01L 23/5226; H01L 23/528
See application file for complete search history.

(56) References Cited

U.S. PATENT DOCUMENTS

| | | |
|---|---|---|
| 5,202,579 A | 4/1993 | Fujii |
| 5,420,072 A | 5/1995 | Fiordalice |

(Continued)

FOREIGN PATENT DOCUMENTS

| | | |
|---|---|---|
| CN | 101236954 A | 8/2008 |
| KR | 2001-0065288 A | 7/2001 |
| KR | 2001-0093456 A | 10/2001 |

*Primary Examiner* — Hoa B Trinh
(74) *Attorney, Agent, or Firm* — Winston Hsu (57) ABSTRACT

The present invention provides a storage node contact structure of a memory device comprising a substrate having a dielectric layer comprising a recess, a first tungsten metal layer, and an adhesive layer on the first tungsten metal layer and a second tungsten metal layer on the adhesive layer, wherein the second tungsten metal layer is formed by a physical vapor deposition (PVD).

5 Claims, 5 Drawing Sheets

(51) Int. Cl.
  *H01L 23/532* (2006.01)
  *H01L 23/522* (2006.01)
  *H01L 21/285* (2006.01)
  *H01L 23/528* (2006.01)
  *H01L 21/768* (2006.01)
  *H01L 49/02* (2006.01)
  *H01L 21/02* (2006.01)

(52) U.S. Cl.
  CPC .... *H01L 21/7685* (2013.01); *H01L 21/76831* (2013.01); *H01L 21/76876* (2013.01); *H01L 21/76877* (2013.01); *H01L 23/528* (2013.01); *H01L 23/5226* (2013.01); *H01L 23/53266* (2013.01); *H01L 28/91* (2013.01); *H10B 12/31* (2023.02); *H10B 12/315* (2023.02); *H01L 21/0217* (2013.01); *H01L 21/0228* (2013.01)

(56) References Cited

U.S. PATENT DOCUMENTS

| | | | |
|---|---|---|---|
| 5,747,379 A * | 5/1998 | Huang | H01L 21/76877 |
| | | | 257/E21.585 |
| 5,893,734 A * | 4/1999 | Jeng | H01L 27/10873 |
| | | | 257/E21.654 |
| 6,022,798 A | 2/2000 | Sumi | |
| 6,060,390 A | 5/2000 | Naito | |
| 6,177,341 B1 | 1/2001 | Lai | |
| 6,218,308 B1 * | 4/2001 | Lou | H01L 28/91 |
| | | | 438/957 |
| 6,350,649 B1 * | 2/2002 | Jeong | H01L 27/10894 |
| | | | 257/E21.649 |
| 7,935,543 B2 * | 5/2011 | Moise, IV | H01L 27/11507 |
| | | | 257/295 |
| 9,466,603 B2 | 10/2016 | Yeom | |
| 9,859,215 B1 * | 1/2018 | Edelstein | H01L 21/76879 |
| 10,121,882 B1 * | 11/2018 | Ho | H01L 29/785 |
| 2007/0018229 A1 | 1/2007 | Yater | |
| 2008/0254617 A1 * | 10/2008 | Adetutu | H01L 23/53238 |
| | | | 438/643 |
| 2009/0250787 A1 | 10/2009 | Kutsunai | |
| 2013/0075908 A1 * | 3/2013 | Cabral, Jr. | H01L 23/53209 |
| | | | 438/653 |
| 2013/0092989 A1 | 4/2013 | Ting | |
| 2013/0164905 A1 | 6/2013 | Yang | |
| 2013/0270703 A1 | 10/2013 | Zierath | |
| 2015/0228491 A1 | 8/2015 | Kang | |
| 2018/0068943 A1 * | 3/2018 | Hu | H01L 23/53228 |

* cited by examiner

STORAGE NODE CONTACT STRUCTURE OF A MEMORY DEVICE

CROSS REFERENCE TO RELATED APPLICATIONS

This application is a divisional application of U.S. patent application Ser. No. 15/922,899 filed Mar. 15, 2018, which is herein incorporated by reference in its entirety.

BACKGROUND OF THE INVENTION

1. Field of the Invention

The present invention relates to a semiconductor device and manufacturing methods thereof, and in particular, to a storage node contact structure and manufacturing methods thereof.

2. Description of the Prior Art

Dynamic random access memory (hereinafter abbreviated as DRAM) is a volatile memory that commonly used as system memory. A memory cell array of DRAM has a configuration in which memory cells, each including an access metal oxide semiconductor (hereinafter abbreviated as MOS) transistor and a storage capacitor, are arranged in array-like manner, i.e. in row and column directions.

The storage capacitors are formed either by etching trenches in the substrate in each of the cell areas, commonly referred to as trench capacitors, or are formed over the access FETs in the cell areas by depositing and patterning conducting layers over the access transistors, and are commonly referred to as stacked capacitors. The capacitors make electrical contact to one of the two source/drain areas (node contact) of each FET, while bit lines make electrical contact to the other source/drain area of each FET. It is becoming increasingly difficult to fabricate more memory cells on a DRAM device while limiting the overall DRAM device area to a practical size without decreasing the cell area. Further, as the cell area decreases, the available area for the storage capacitor in each cell also decreases. This makes it difficult to maintain sufficient capacitance to provide the necessary signal-to-noise ratio. Also, the refresh cycle time necessary to maintain sufficient charge on these capacitors also decreases, resulting in DRAM devices with reduced performance (speed).

SUMMARY OF THE INVENTION

The present invention provides a storage node contact structure of a memory device, the storage node contact structure includes a substrate having a dielectric layer, the dielectric comprises a recess, a first tungsten metal layer disposed in the recess and filling the recess, and a second tungsten metal layer disposed on the first tungsten metal layer, wherein the second tungsten metal layer is formed by a physical vapor deposition (PVD) method.

The present invention further provides a method for forming a storage node contact structure of a memory device, the method including: firstly, a substrate having a dielectric layer is provided, the dielectric comprises a recess, next, a first tungsten metal layer is formed in the recess and filling the recess, afterwards, a planarization step is performed to removes a portion of the first tungsten metal layer, an adhesive layer is then formed on the first tungsten metal layer, and a second tungsten metal layer is formed on the first tungsten metal layer by a physical vapor deposition (PVD) method.

The present invention further provides a method for forming a storage node contact structure of a memory device, the method including: firstly, a substrate having a dielectric layer is provided, the dielectric comprises a recess, next, a first tungsten metal layer is formed in the recess and filling the recess, afterwards, a planarization step is performed to removes a portion of the first tungsten metal layer, an adhesive layer is then formed on the first tungsten metal layer, and a second tungsten metal layer is formed on the first tungsten metal layer by a physical vapor deposition (PVD) method, and an annealing step is performed on the first tungsten metal layer, the adhesive layer and the second tungsten metal layer.

In summary, the present invention is characterized in that divides the integrally conductive layer (for example, tungsten) of the storage node contact structure into upper layer and lower layer, and the two layers are formed by different processes. In particular, the upper conductive layer is formed by physical vapor deposition (PVD) process and has the advantages of surface smoothness and better electrical conductivity, thereby increasing the overall quality of the memory device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
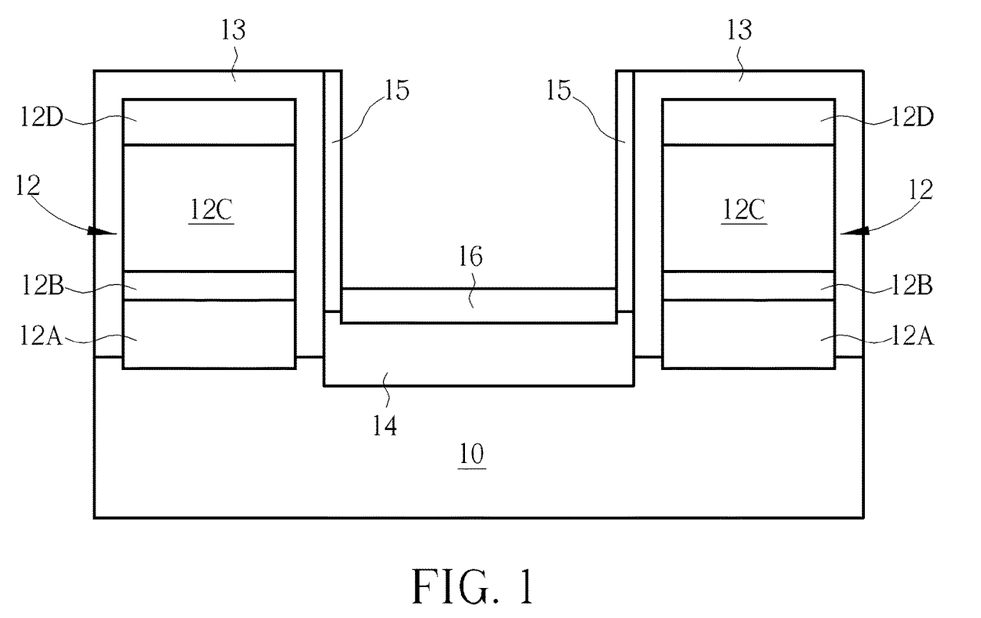
FIG. 1 to FIG. 7 are schematic diagrams illustrating the storage node contact structure in the memory device according to one preferred embodiment of the present invention.

Please refer to FIG. 1 to FIG. 7, which are flowcharts illustrating the storage node contact structure in the memory device of the present invention. Firstly, as shown in FIG. 1, a substrate 10 is provided. A plurality of active regions (not shown) are disposed in the substrate 10 and a shallow trench isolation (not shown) surrounding the active regions. A plurality of word lines and a plurality of bit lines are disposed on or disposed in the substrate 10, the word lines are preferably buried word lines (not shown) located inside the substrate 10, and cross the shallow trench isolation and the active regions. Each bit line 12 is located above the substrate 10 and electrically connects the active region between any two word lines. Each of the bit lines 12 may include a multi-layer structure, which in this embodiment may include a titanium silicide layer 12A, a tungsten silicide layer 12B, a conductive layer (tungsten) 12C and a mask layer 12D made of an insulating material. A dielectric layer 13 is then formed to completely cover each bit line 12. A recess 18 is disposed between the two bit lines 12, the recess 18 serves as a location for a following-formed storage node contact structure, and the storage node contact structure will connect the source/drain of the corresponding active region and the subsequently formed capacitor. The bottom of the recess 18 includes an epitaxial layer 14 (in this embodiment, for example, SiP). The epitaxial layer 14 is connected to the source/drain. The epitaxial layer 14 further comprises a metal silicide layer 16 (for example, CoSi). In addition, spacers 15 may be formed on the inner sidewall of the bit lines 12, the spacer 15 may be a single layer or a composite layer of insulating material such as silicon nitride or silicon oxide.

Figure 2:
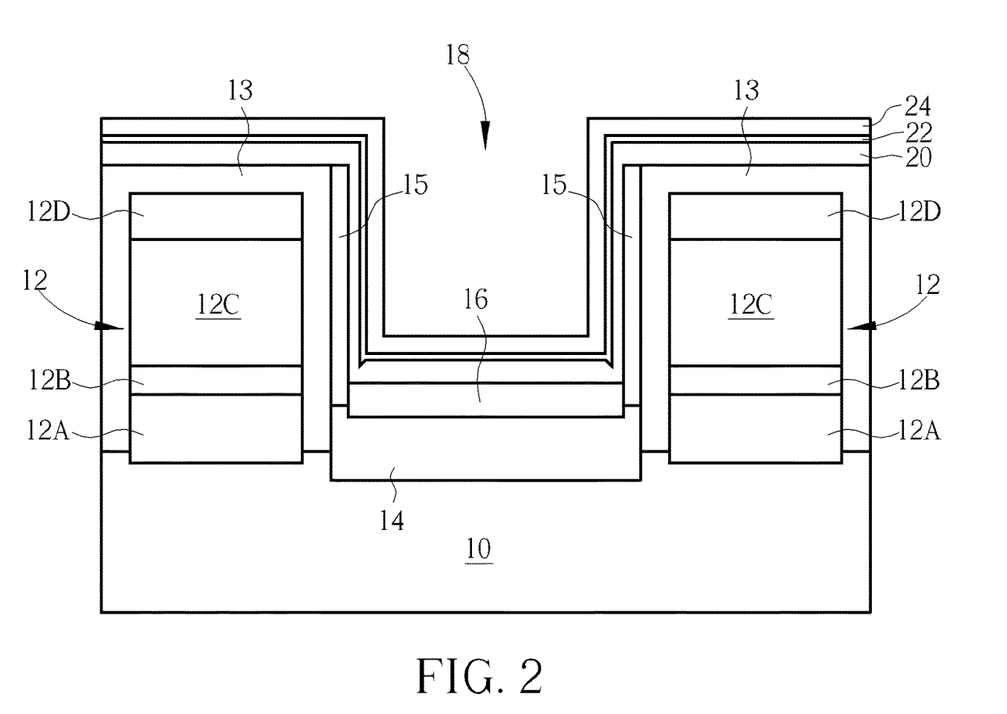

Next, as shown in FIG. 2, a liner 20, a seed layer 22 and a dielectric layer 24 are sequentially formed in the recess 18. The liner 20 is, for example, a composite layer of titanium/titanium nitride. In this embodiment, a titanium layer is formed by physical vapor deposition (PVD) to a thickness of about 20 angstroms, and then a titanium nitride layer is deposited by atomic layer deposition (ALD), the titanium nitride layer is formed to a thickness of about 30 angstroms. Next, a seed layer 22 of tungsten is formed to facilitate the growth of a subsequent conductive layer (tungsten), the thickness of the seed layer 22 is about 20 angstroms, and a dielectric layer 24 is formed by atomic layer deposition, such as silicon nitride, having a thickness of about 30 angstroms. The above-mentioned material and thickness of each layer are parameters of one embodiment of the present invention. However, the material and the thickness of each element of the present invention are not limited to those described above, and may be adjusted according to actual requirements. Besides, in some embodiment, the present invention can also utilize the titanium layer of the composite layer structure in the liner 20 to directly react into the metal silicide layer 16, therefore, the aforementioned step of forming the metal silicide layer 16 before forming the liner layer 20 can be omitted.

Figure 3:
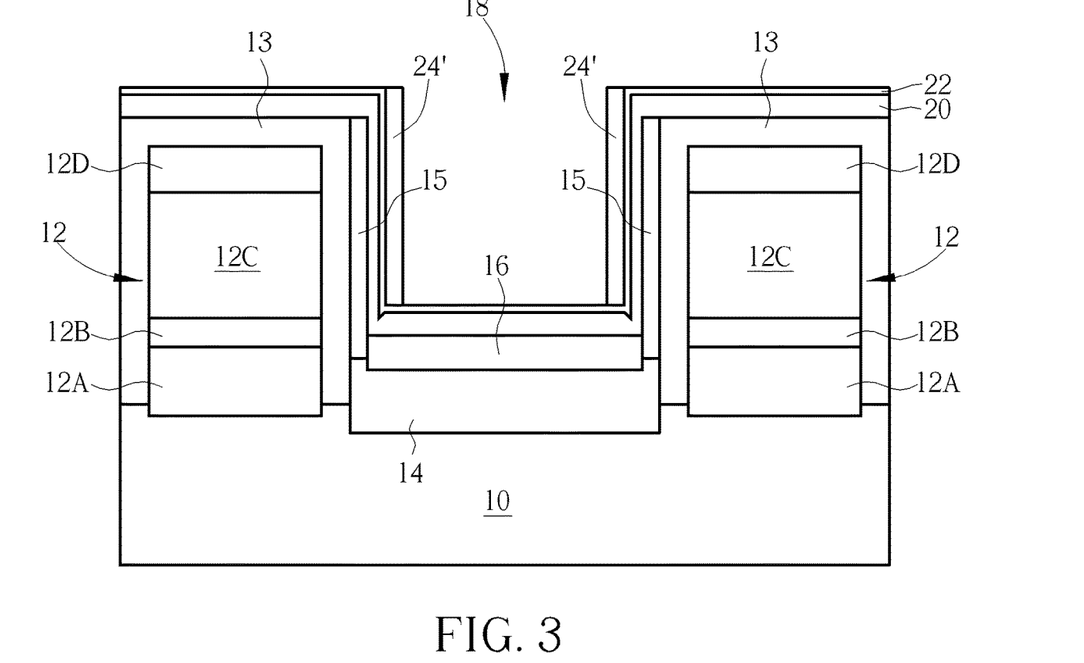
Figure 4:
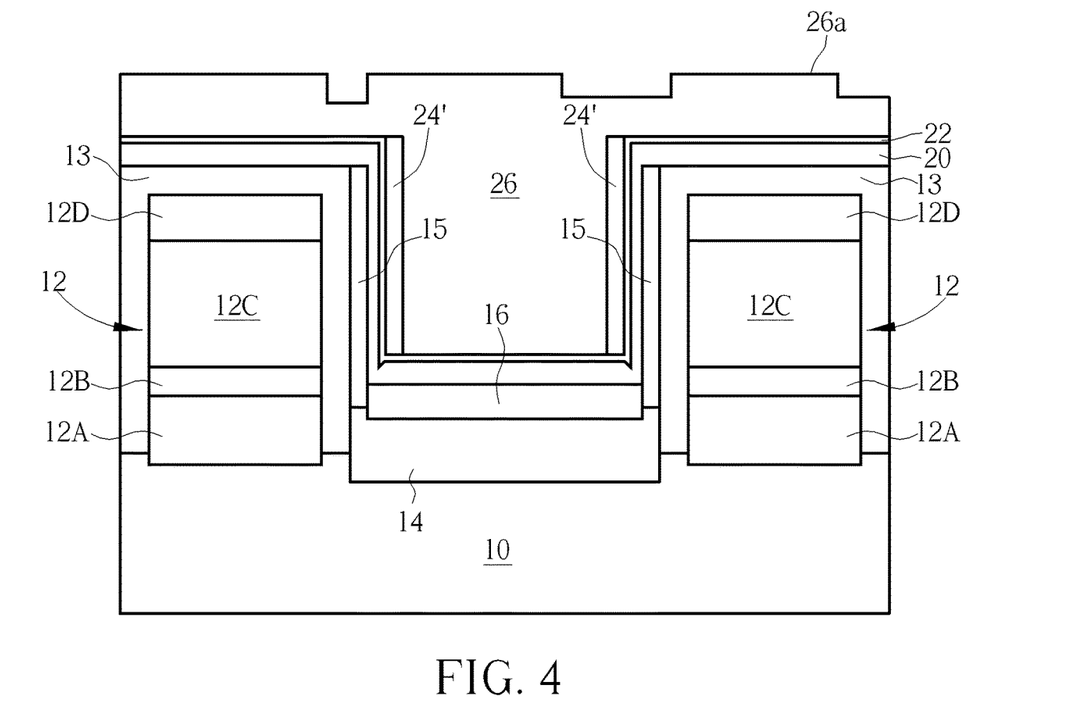

As shown in FIG. 3, an etch back step is performed to remove portions of the dielectric layer 24, particularly the dielectric layer 24 disposed on the top surface of the seed layer 22 is removed, leaving only the dielectric located on the sidewalls of the recess 18 (the remaining dielectric layer is defined as spacers 24'). Next, as shown in FIG. 4, a conductive layer 26 is formed in the recess 18 and fills the recess 18. In addition, the conductive layer 26 also covers the bit lines 12 at the same time. In this embodiment, the material of the conductive layer 26 is tungsten. However, in the present invention, other suitable conductive materials may be used instead of tungsten, and an appropriate seed layer 22 material may be adjusted. It should be noticed here that since the inner sidewalls of the recess 18 are covered by the spacers 24', the seed layer 22 along with the sidewalls is also covered. Only the seed layer 22 located at the bottom of the recess 18 is exposed. Therefore, during the process for forming the conductive layer 26, the vertical growth rate of the conductive layer 26 will be greater than that of the lateral growth (because the seed layer 22 located on the vertical sidewall is covered), thus effectively reducing the overhang phenomenon, and to reduce the probability of leaving a void within the recess 18 after the conductive layer 26 is completed.

Figure 5:
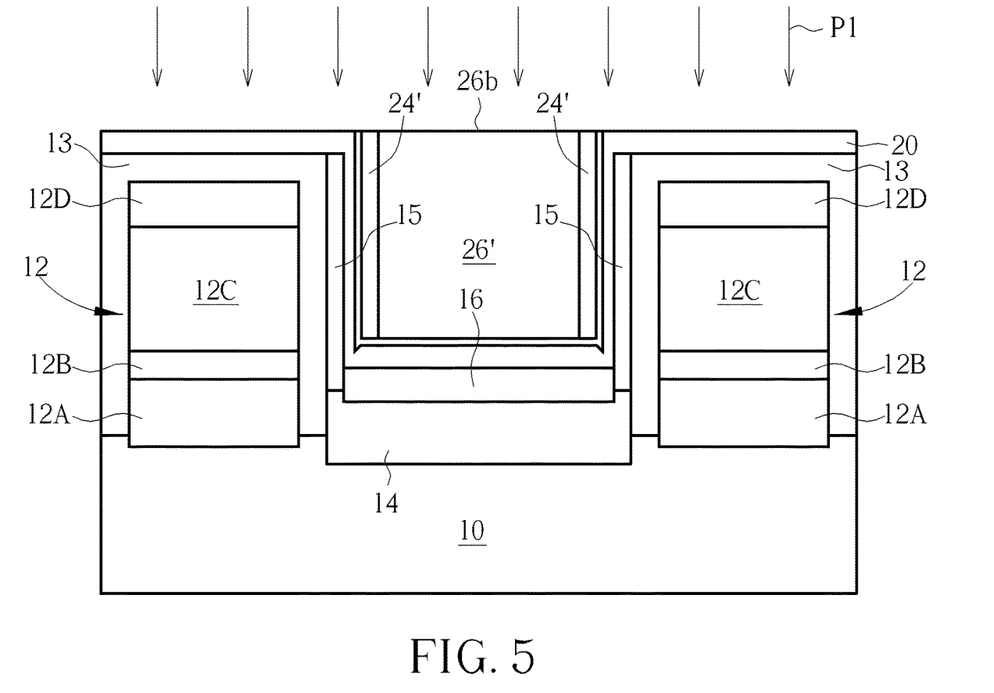

It is also worth noting that in the step of FIG. 4, the conductive layer 26 is formed by chemical vapor deposition (CVD). However, the applicant has found that the completed conductive layer 26 has a rough surface 26a, which is harmful to the formation of the following-formed storage node contact structure. Therefore, as shown in FIG. 5, a planarization step P1 is performed to remove portions of the conductive layer 26 and the seed layer 22, and expose the liner 20 located above each of the bit lines 12. When the planarization step P1 is completed, the remaining conductive layer is defined as conductive layer 26', which has a relatively flat surface 26b. In addition, the surface 26b of the conductive layer 26' is aligned with the top surface of the liner 20, while the liner 20 still completely covers each of the bit lines 12 and the recess 18.

Figure 6:
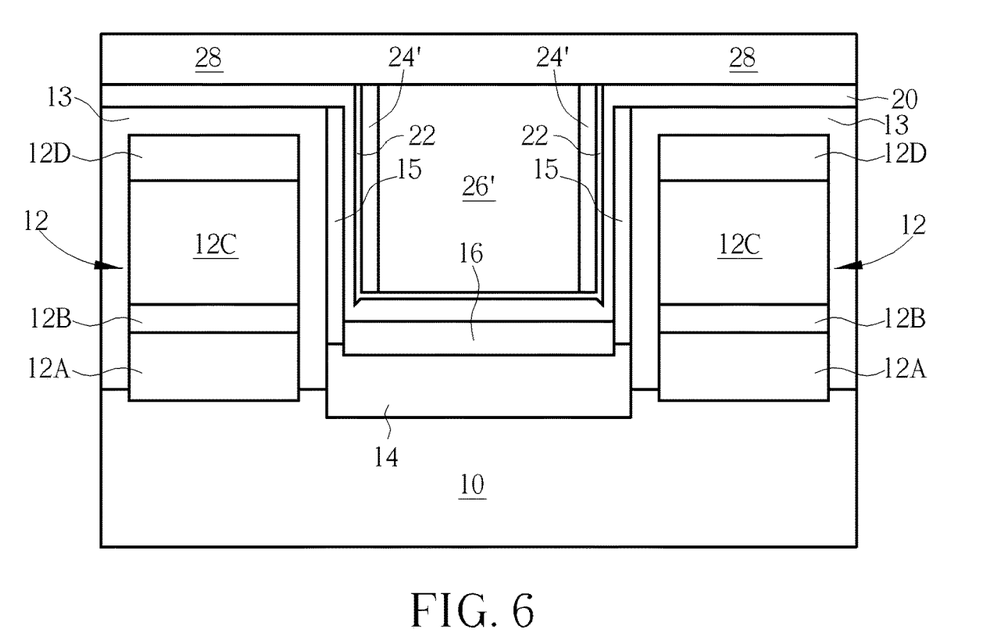

As shown in FIG. 6, another conductive layer 28 is subsequently formed by a physical vapor deposition (PVD) method, electrically connected and directly contact to the conductive layer 26'. For example, the conductive layer 28 is made of tungsten. It is worth noting that the conductive layer 28 is formed by physical vapor deposition in this step, rather than the chemical vapor deposition. In the process of physical vapor deposition, the gas used is simpler (for example, only argon), applicants have also found that forming the conductive layer 28 by physical vapor deposition reduces the resistance of the overall storage node contact structure. For example, if the storage node contact structure are completely formed by chemical vapor deposition method, the resistance is about 12 to 20 ohm cm, and in the manner described in the present invention, the conductive layer 26' is first formed by chemical vapor deposition, then, a conductive layer 28 is formed on the conductive layer 26' by physical vapor deposition. The resistance of the storage node contact structure is reduced to approximately 9 to 11 ohm cm.

Figure 7:
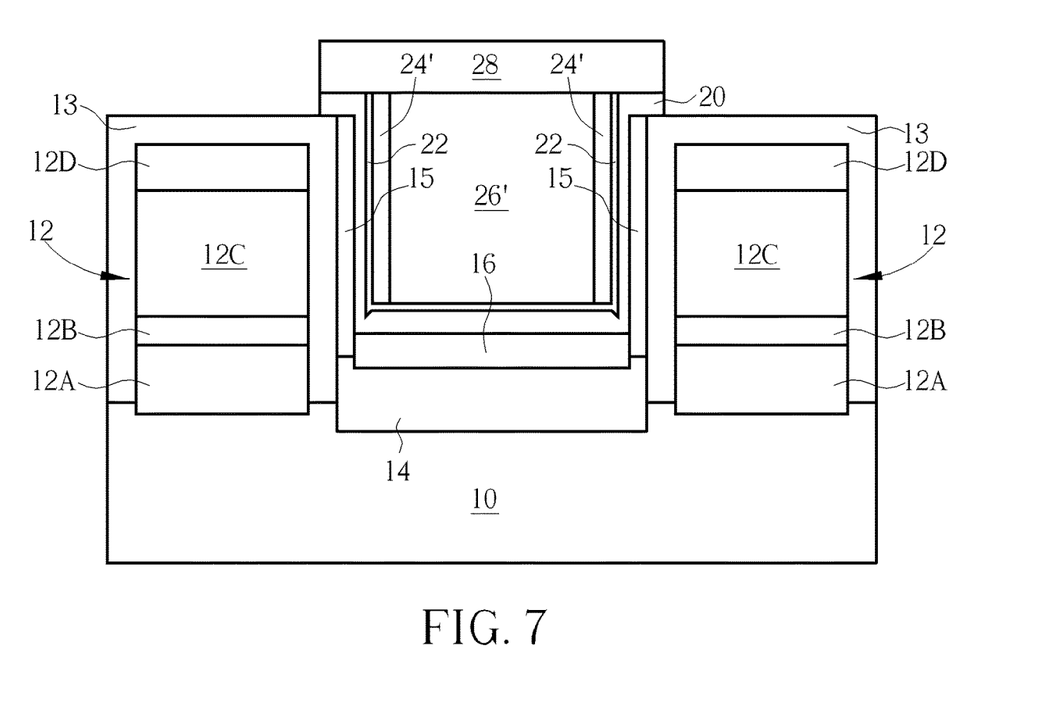

In a subsequent step, as shown in FIG. 7, the conductive layer 28 is patterned to remove portions of the conductive layer 28 and portions of the liner 20, until the dielectric layer 13 on each of the bit lines 12 is exposed. In this step, when viewed in the cross-sectional view, the remaining liner 20 has the shape of an inverted Ω, while the conductive layer 28 has a flat structure, and the remaining conductive layer 28 forms a landing pad between the storage node contact structure and the capacitor. Afterwards, the capacitor or other devices are formed. The steps are well-known in the art, and the present invention will not be further described herein.

The following description will detail the different embodiments of the memory device and the manufacturing method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 8:
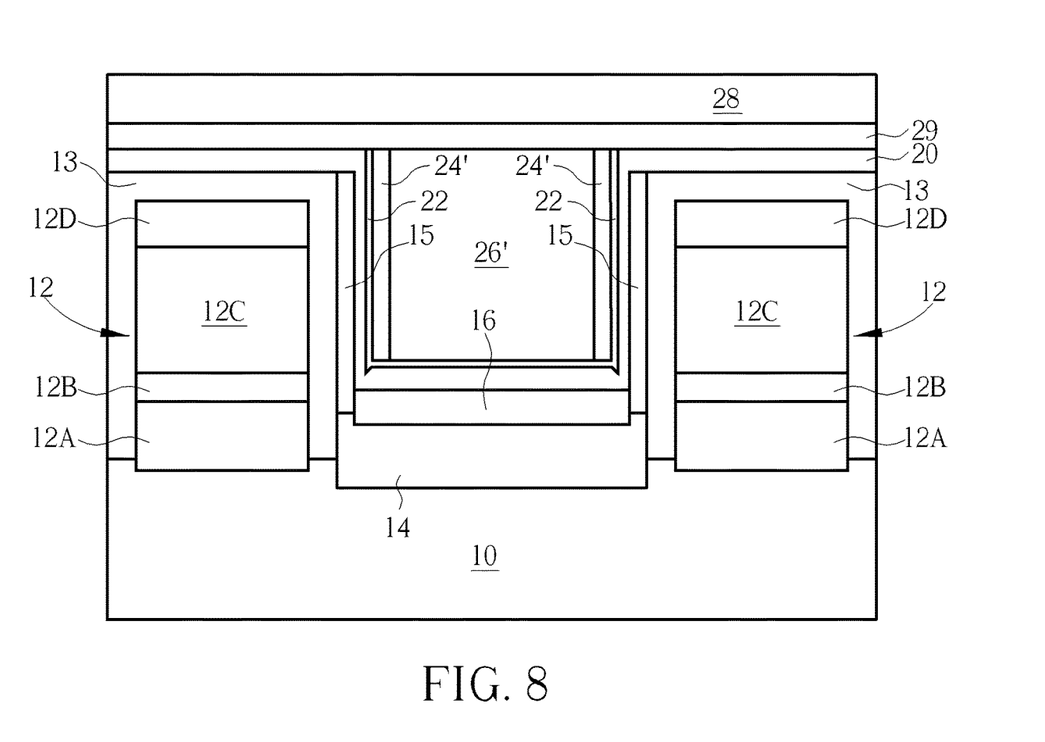
FIG. 8 is schematic diagram illustrating the storage node contact structure in the memory device according to another embodiment of the present invention.

In the second embodiment of the present invention, as shown in FIG. 8, after the steps described in FIG. 5 are completed (the steps in the second embodiment of the present invention are the same as those in the foregoing FIG. 1 to FIG. 5 and will not be described herein again), before the conductive layer 28 is formed by physical vapor deposition, an adhesive layer 29 is formed on the surface of the conductive layer 26'. In addition, the adhesive layer 29 may also cover the surface of the liner 20, but the present invention is not limited thereto. The purpose of forming the adhesive layer 29 is to increase the adhesion between the conductive layer 26' and the conductive layer 28, so as to reduce the interfacial resistance therebetween. The adhesive layer 29 is made of titanium or tantalum. Therefore, the adhesive layer 29 is formed between the conductive layer 28 formed by PVD and the conductive layer 26' formed by CVD, and a portion of the adhesive layer 29 is also formed between the liner 20 and the conductive layer 28.

Figure 9:
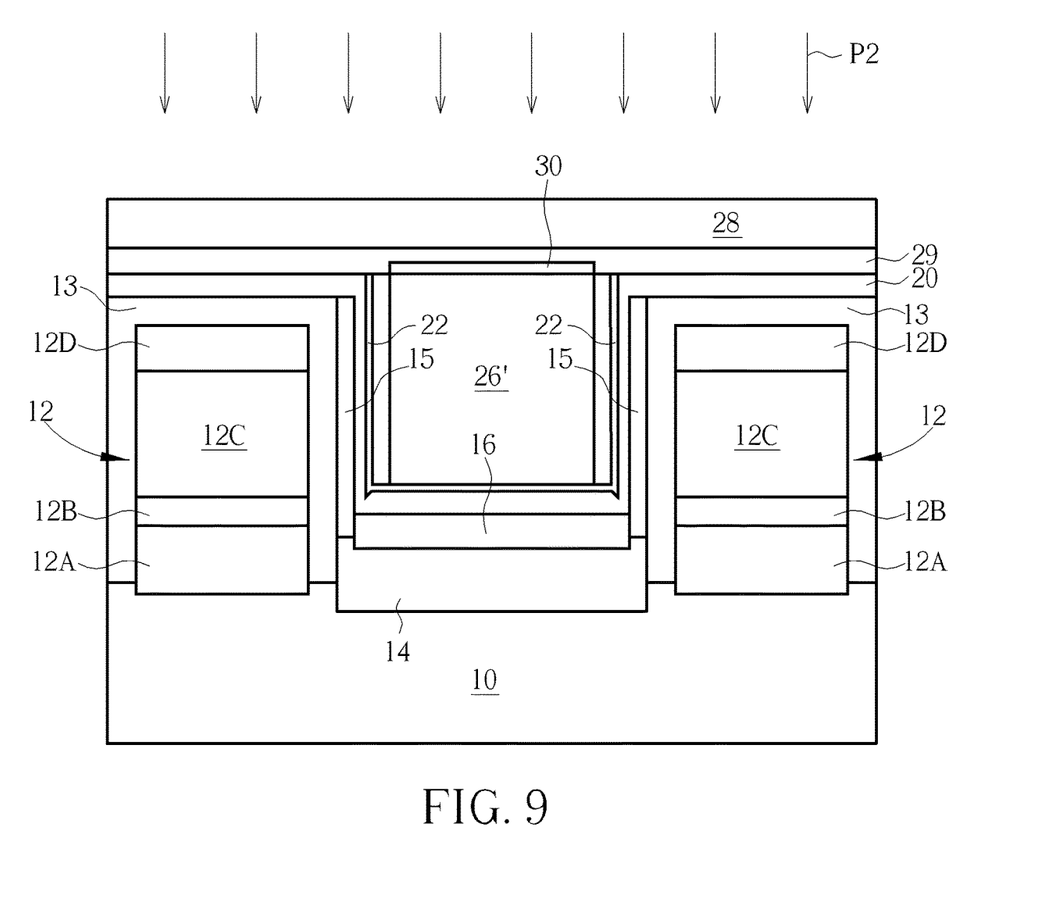
FIG. 9 is schematic diagram illustrating the storage node contact structure in the memory device according to another embodiment of the present invention.

In an embodiment of the present invention, as shown in FIG. 9, if the adhesive layer 29 is formed, it is possible that an oxidation reaction may occur between the adhesive layer 29 and the surface of the planarized conductive layer 26'. For example, an oxide layer 30 may be formed between the adhesive layer 29 and the planarized conductive layer 26'. The oxide layer 30 may be made of titanium oxide or tantalum oxide (depending on whether the adhesive layer 29 is made of titanium or tantalum). In order to reduce the adverse effect caused by the oxide layer 30, an additional annealing step P2 is performed in FIG. 9 after the conductive layer 28 is completed. The annealing step P2 can eliminate the oxide layer 30 located between the adhesive layer 29 and the planarized conductive layer 26' or reduce the influence of the oxide layer 30, thereby reducing the interface resistance between the adhesive layer 29 and the planarized conductive layer 26'. In this way, the conductivity of overall contact structure can be increased. The above step should also be within the scope of the present invention.

In summary, the present invention is characterized in that divides the integrally conductive layer (for example, tungsten) of the storage node contact structure into upper layer and lower layer, and the two layers are formed by different processes. In particular, the upper conductive layer is formed by physical vapor deposition (PVD) process and has the advantages of surface smoothness and better electrical conductivity, thereby increasing the overall quality of the memory device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A storage node contact structure of a memory device, comprising:
   a substrate having a dielectric layer, the dielectric comprises a recess;
   a first tungsten metal layer disposed in the recess and filling the recess;
   a spacer, disposed beside the first tungsten metal layer and directly contacts the first tungsten metal layer, wherein the spacer does not contact a bottom surface of the first tungsten metal layer directly;
   a second tungsten metal layer disposed on the first tungsten metal layer, wherein the second tungsten metal layer is formed by a physical vapor deposition (PVD) method; and
   an adhesive layer disposed between the first tungsten metal layer and the second tungsten metal layer, wherein a material of the adhesive layer comprises titanium or tantalum, wherein the adhesive layer directly contacts a top surface of the dielectric layer, wherein a width of the adhesive layer is same as a width of the second tungsten metal layer, and the width of the adhesive layer is larger than a width of the first tungsten metal layer.

2. The storage node contact structure of claim 1, wherein the adhesive layer covers a top surface of the first tungsten metal layer and a top surface of the dielectric layer.

3. The storage node contact structure of claim 2, wherein the top surface of the first tungsten metal layer and the top surface of the dielectric layer are on a same level.

4. The storage node contact structure of claim 1, further comprising two bit line gate electrodes located in the dielectric layer at two sides of the recess respectively.

5. The storage node contact structure of claim 1, wherein the first tungsten metal layer is formed by a chemical vapor deposition method.

* * * * *

UNITED STATES PATENT AND TRADEMARK OFFICE
CERTIFICATE OF CORRECTION

PATENT NO. : 11,877,433 B2  
APPLICATION NO. : 16/931397  
DATED : January 16, 2024  
INVENTOR(S) : Pin-Hong Chen et al.

Page 1 of 1

It is certified that error appears in the above-identified patent and that said Letters Patent is hereby corrected as shown below:

On the Title Page

Item (72), correct the addresses of:
The 9th inventor (Hsin-Fu Huang) from "Taichung (TW)" to --Tainan (TW)--, and
The 11th inventor (Li-Wei Feng) from "Tainan (TW)" to --Kaohsiung (TW)--.

Signed and Sealed this  
Twenty-seventh Day of February, 2024

Katherine Kelly Vidal  
*Director of the United States Patent and Trademark Office*